United States Patent
Ebbesen et al.

[19]

[11] Patent Number: 6,052,238
[45] Date of Patent: Apr. 18, 2000

[54] NEAR-FIELD SCANNING OPTICAL MICROSCOPE HAVING A SUB-WAVELENGTH APERTURE ARRAY FOR ENHANCED LIGHT TRANSMISSION

[75] Inventors: Thomas W. Ebbesen, Plainsboro; Hadi F. Ghaemi; Tineke Thio, both of Princeton, all of N.J.; Peter A. Wolff, Boston, Mass.

[73] Assignee: NEC Research Institute, Inc., Princeton, N.J.

[21] Appl. No.: 09/283,496

[22] Filed: Apr. 1, 1999

Related U.S. Application Data

[62] Division of application No. 08/979,432, Nov. 26, 1997, Pat. No. 5,973,316.
[60] Provisional application No. 60/051,904, Jul. 8, 1997.

[51] Int. Cl.[7] ............................. G02B 9/00; G02B 6/00; G10J 1/04
[52] U.S. Cl. .............. 359/738; 250/227.11; 250/227.23; 250/227.34; 359/656; 385/5; 385/12; 385/13; 385/31
[58] Field of Search ................................ 250/216, 227.11, 250/234, 236, 306, 307, 227.23, 227.24; 359/738, 619, 321, 656; 385/123, 31, 12, 13, 5, 115–121, 43, 147, 126–128

[56] References Cited

U.S. PATENT DOCUMENTS

| | | | |
|---|---|---|---|
| 3,866,037 | 2/1975 | Simpson | 250/210 |
| 4,360,273 | 11/1982 | Thaxter | 356/354 |
| 4,405,238 | 9/1983 | Grobman et al. | 356/401 |
| 4,411,013 | 10/1983 | Takasu et al. | 378/34 |
| 4,659,429 | 4/1987 | Isaacson et al. | 156/644 |
| 4,662,747 | 5/1987 | Isaacson et al. | 356/317 |
| 4,815,854 | 3/1989 | Tanaka et al. | 356/356 |
| 4,891,830 | 1/1990 | Iwahashi | 378/35 |
| 5,250,812 | 10/1993 | Murai et al. | 250/492.2 |
| 5,306,902 | 4/1994 | Goodman | 250/201.3 |
| 5,351,127 | 9/1994 | King et al. | 356/445 |
| 5,354,985 | 10/1994 | Quate | 250/234 |
| 5,451,980 | 9/1995 | Simon et al. | 345/88 |
| 5,570,139 | 10/1996 | Wang | 348/744 |
| 5,633,972 | 5/1997 | Walt et al. | 385/116 |
| 5,663,798 | 9/1997 | Karrai | 356/384 |
| 5,789,742 | 8/1998 | Wolff | 250/227.11 |
| 5,933,233 | 8/1999 | Gunther | 356/318 |

FOREIGN PATENT DOCUMENTS 405240787  9/1993  Japan.

OTHER PUBLICATIONS

Bethe, H. A., "Theory of Diffraction by Small Holes," *The Physical Review*, vol. 66, Nos. 7 and 8, pp. 163–182 (Oct. 1944).

Caldwell, M. E. et al., "Surface–plasmon spatial light modulators based on liquid crystal," *Applied Optics*, vol. 31, No. 20, pp. 3880–3891 (Jul. 1992).

Chown, M., "Tight fit," *New Scientist*, No. 2121 (Feb. 1998).

Cowan, J. J., "Aztec surface–relief volume diffractive structure," *Journal of the Optical Society of America*, vol. 7, No. 8, pp. 1529–1544 (Aug. 1990).

Ebbesen, T.W. et al., "Extraordinary optical transmission through sub–wavelength hole arrays," *Nature*, vol. 391, pp. 667–669 (Feb. 1998).

(List continued on next page.)

Primary Examiner—Georgia Epps
Assistant Examiner—David N. Spector
Attorney, Agent, or Firm—Philip J. Feig; Andrew G. Isztwan

[57] ABSTRACT

A metallic film has apertures located therein in an array arranged in a pattern so that when light is incident on the apertures, surface plasmons on the metallic film are perturbed resulting in an enhanced transmission of the light emitted from individual apertures in the array. The aperture array is used: to filter light of predetermined wavelength traversing the apertures, to collect light over a distance after traversing the apertures, to improve operation of near-field scanning optical microscopes, and to enhance light transmission through masks useable in photolithography.

8 Claims, 10 Drawing Sheets

OTHER PUBLICATIONS

Evans, A. F. et al., "Measurement of the electrically induced refractive index change in silicon for wavelength $\lambda=1.3\,\mu m$ using a Schottky diode," *Applied Physics Letters*, vol. 56, No. 3, pp. 212–214 (Jan. 1990).

Haginoya, C. et al., "Nanostructure array fabrication with a size–controllable natural lithography," *Applied Physics Letters*, vol. 71, No. 20, pp. 2934–2936 (Nov. 1997).

Lezec, H., "Light Squeeze," *Science NOW* (Feb. 11, 1998).

Ghaemi, H. F. et al., "Surface plasmons enhance optical transmission through subwavelength holes," *Physical Review B*, vol. 58, No. 11, pp. 6779–6782 (Sep. 1998).

Raether, H., *Surface Plasmons on Smooth and Rough Surfaces and on Gratings*, Springer–Verlag, pp. 1–136 (1998).

Sambles, R., "More than transparent", *Nature*, vol. 391, pp. 641–642 (Feb. 1998).

Ordal, M. A. et al., "Optical properties of the metals Al, Co, Cu, Au, Fe, Pb, Ni, Pd, Pt, Ag, Ti and W in the infrared and far infrared," *Applied Optics*, vol. 22, No. 7, pp. 1099–1119 (Apr. 1983).

Solgaard, O. et al., "High frequency attenuated total internal reflection light modulator," *Applied Physics Letters*, vol. 61, No. 21, pp. 2500–2502 (Nov. 1992).

Van Belle, M., "Photons Squeeze Through Tiny Holes," *Photonics Spectra*, pp. 36–37 (May 1998).

Villeneuve, P. R., "Light beats the diffraction limit," *Physics World*, pp. 28–29 (Apr. 1998).

Wang, Y., "Voltage–induced color–selective absorption with surface plasmons," *Applied Physics Letters*, vol. 67, No. 19, pp. 2759–2761 (Nov. 1995).

Weber, W. H. et al., "Optical electric–field enhancement at a metal surface arising from surface–plasmon excitation," *Optics Letters*, vol. 6, No. 3, pp. 122–124 (Mar. 1981).

Boardman, A.D. (ed.), *Electromagnetic Surface Modes*, Wiley–Interscience Publication, pp. 1–76, 661–724 (1982).

Wood, R. W., "Anomalous Diffraction Gratings," *Physical Review*, vol. 48, pp. 928–936 (Dec. 1935).

Wood, R. W., "On a Remarkable Case of Uneven Distribution of Light in a Diffraction Grating Spectrum," *Philosophical Magazine*, vol. 4, pp. 396–403 (Jun. 1902).

Yeatman, E. M. et al., "Spatial light modulation using surface plasmon resonance," *Applied Physics Letters* vol. 55, No. 7, pp. 613–615 (Aug. 1989).

"Flooding light through tiny holes," *Science News*, vol. 153, No. 9 (Feb. 1998).

"Startling Amount of Light Gets Through Tiny Holes," John Wiley & Sons (1998).

Botten, L.C. et al., "Inductive Grids in the Resonant Region: Theory and Experiment," *International Journal of Infrared and Millimeter Waves*, vol. 6, No. 7, pp. 511–575 (1985).

Ulrich, R., "Far–Infrared Properties of Metallic Mesh and Its Complementary Structure," *Infrared Physics*, vol. 7, pp. 37–55 (1967).

John, S., "Localization of Light", *Physics Today*, p. 32 (May 1991).

Yablonivitch, E. et al., "Hope for Photonic Bandgaps," *Nature*, vol. 351, p. 278 (1991).

Dalichaouch, R. et al., "Microwave Localization by Two–Dimensional Random Scattering," *Nature*, vol. 354, pp. 53–55 (1991).

Joannopoulus, J.D. et al., *Photonic Crystals*, Princeton University Press, pp. 4–7 (1995).

Haroche, S. et al., "Cavity Quantum Electrodynamics," *Physics Today*, pp. 24–30 (Jan. 1989).

Betzig, E. et al., "Near–Field Optics: Microscopy, Spectroscopy and Surface Modification Beyond the Diffraction Limit," *Science*, vol. 189, pp. 189–194 (1992).

Born, M. et al, *Principles of Optics*, Pergamon Press, pp. 401–409 (1980).

Ritchie, R.H. et al., "Surface–Plasmon Resonance Effect in Grating Diffraction," *Physical Review Letters*, vol. 21, No. 22, pp. 1530–1553 (1968).

Chen, Y.J. et al., "Surface Plasmons on Gratings: Coupling in the Minigap Regions," *Solid State Communications*, vol. 46, No. 2, pp. 95–99 (1983).

Kitson, S.C. et al., "Full Photonic Band Gap for Surface Modes in the Visible," *Physical Review Letters*, vol. 77, No. 13, pp. 2670–2673 (1996).

Lochbihler, H. et al., "Surface Polaritons on Gold–Wire Gratings," *Physical Review B*, vol. 50, No. 7, pp. 4795–4801 (1994).

Drexehage, K.H., "Interaction of Light with Monomolecular Dye Layers," *Progress in Optics*, vol. 12, pp. 165–232 (1974).

Roberts, A., "Near–zone fields behind circular apertures in thick, perfectly conducting screens," *Journal of Applied Physics*, vol. 65, No. 8, pp. 2896–2899 (1989).

Roberts, A., "Small–hole coupling of radiation into a near–field probe," *Journal of Applied Physics*, vol. 70, No. 8, pp. 4045–4049 (1991).

Wessel, J., "Surface–enhanced optical microscopy," *Journal of the Optical Society of America B*, vol. 2, No. 9, pp. 1538–1541 (1985).

Fischer, U., "Submicrometer aperture in a thin metal film as a probe of its microenvironment through enhanced light scattering and fluorescence", *Journal of the Optical Society of America B*, vol. 3, No. 10, pp. 1239–1244, (1986).

Specht, M. et al., "Scanning plasmon near–field microscope," *Physical Review Letters*, vol. 68, No. 4, pp. 476–497 (1992).

Ulrich, R., "Interference Filters for the Far Infrared," *Applied Optics*, vol. 7, No. 10, pp. 1987–1996 (1968).

Sakai, K. et al., "Metallic Mesh Bandpass Filters and Fabry–Perot Interferometer for the Far Infrared," *Japanese Journal of Applied Physics*, vol. 8, No. 8, pp. 1046–1055 (1969).

Renk, K.F. et al., "Interference Filters and Fabry–Perot Interferometers for the Far Infrared", *Applied Optics*, vol. 1, No. 5, pp. 643–648 (1962).

Garg, R.K. et al, "Far–infrared characteristics of multi–element interference filters using different grids," *Infrared Physics*, vol. 18, pp. 292–298 (1978).

Chase, S.T. et al., "Resonant array bandpass filters for the far infrared," *Applied Optics*, vol. 22, No. 1, pp. 1775–1779 (1983).

Larsen, T., "A Survey of the Theory of Wire Grids," *IRE Transactions on Microwave Theory & Techniques*, pp. 191–201 (1962).

Grupp, D.E. et al., "Beyond the Bethe Limit: Tunable Enhanced Light Transmission Through a Single Sub–Wavelength Aperture," *Advanced Materials*, vol. 11, No. 10, pp. 860–862 (1999).

U.S. application No. 09/168,265, Kim et al., filed Oct. 8, 1998.

U.S. application No. 09/208,116, Ebbesen et al., Dec. 9, 1998.

U.S. application No. 09/435,132, Kim et al., filed Nov. 5, 1999.

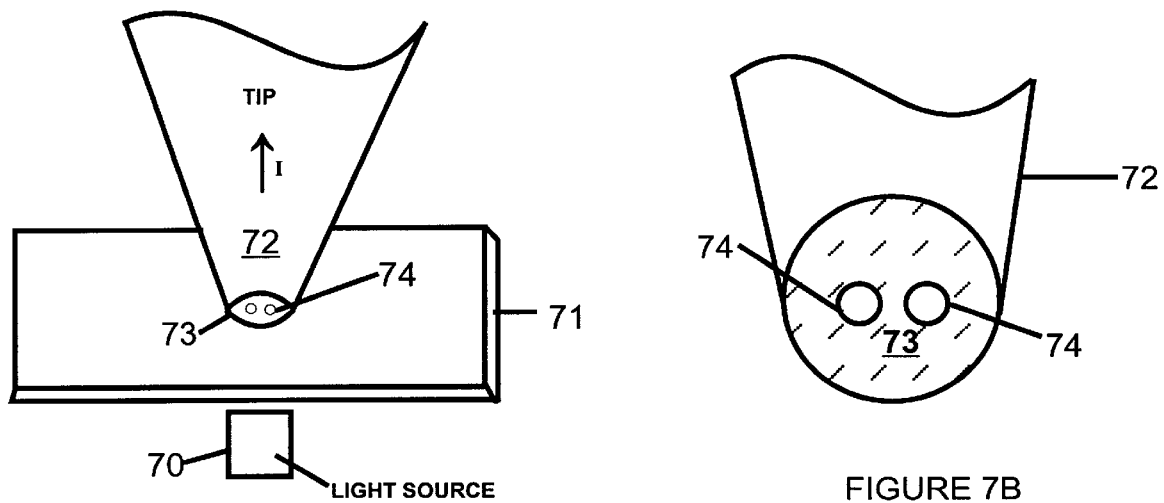
FIGURE 7A
FIGURE 7B
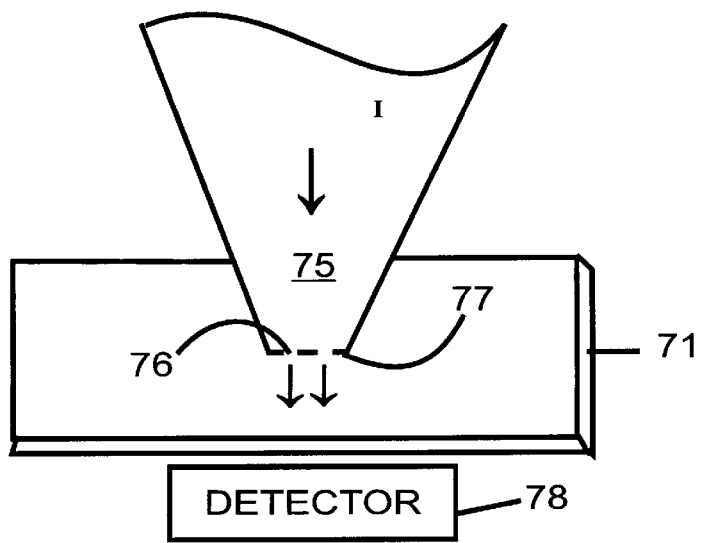
FIGURE 7C

NEAR-FIELD SCANNING OPTICAL MICROSCOPE HAVING A SUB-WAVELENGTH APERTURE ARRAY FOR ENHANCED LIGHT TRANSMISSION

CROSS-REFERENCE TO RELATED APPLICATIONS

This application is a division of U.S. patent application Ser. No. 08/979,432, filed Nov. 26, 1997, now U.S. Pat. No. 5,973,316 issued Oct. 26, 1999, and claims the benefit of U.S. Provisional Patent Application Ser. No. 60/051,904, filed Jul. 8, 1997.

FIELD OF THE INVENTION

The present invention relates to optical transmission through sub-wavelength aperture arrays and particularly relates to improved transmission of light through such apertures.

BACKGROUND OF THE INVENTION

There has been great interest to control and use light, or photons, in the same way that electrons are put to use in solids to make all types of electronic devices and provide communication between distant points. The development of fiber optics and semiconductor lasers have revolutionized the telecommunications industry. Optics is at the heart of the fabrication of integrated circuits, data storage, compact discs, and so forth. However, while the use of light has already demonstrated many advantages, there are considerable challenges ahead to fully make use of its potential. For example, it is desirable to engineer materials so that the propagation of light occurs only in certain directions for certain frequencies (i.e. photonic band gap materials). Efforts in these areas have led to translucent dielectric materials, known as photonic band gap materials or structures, which are opaque at certain frequencies. Light modes cannot propagate through the materials if their frequencies are within those defined by the band gap. The limitations of such materials is that they will permit light transmission at nearby frequencies. That is, these materials only block a narrow range of frequencies within a broad spectrum. Optical detectors are normally sensitive to a broad spectrum of light so that light of slightly different frequencies from that which is blocked might get through to the detectors and be detected. Therefore it would be much more useful to have a material or a device that operates exactly in a reverse manner, that is, it selectively transmits light only in a narrow range of frequencies within a broad spectrum.

The present invention has application in many areas, including those where the divergence of a light beam is a problem, or where increased light transmission through an aperture array is desirable, or in photolithography, or in optical filtering applications.

Opto-electronics, for example, is concerned with optical inter-chip communication in order to increase computation speed. The chips are usually all located on the same board and efforts are made to integrate optical lasers emitting from one chip to detectors located on other chips. One of the difficulties encountered is to make sure the emitted light does not diverge but rather remains collimated over sufficiently long distances so that the light reaches the desired detector or so that the light can be input into a fiberoptic bundle where each fiber is connected to a preselected chip or destination. As the structures and beam sizes approach that of the wavelength of light, the divergence and transmission of the light become even greater problems.

Also, conventional microscopes, and generally optical imaging and storage devices which operate in the far field, cannot resolve features substantially smaller than about one-half the wavelength of the light used. In order to overcome this resolution problem, near-field scanning optical microscopes (NSOM) were developed where an aperture much smaller than the wavelength of the probing light is placed near the specimen and scanned over its surface. A fraction of the light passing through the specimen is then collected through the aperture and relayed to a photodetector. Alternatively, light passes through the aperture, through the specimen and is then captured by a photodetector. The image of the specimen is then reconstructed by combining the signal at the photodetector with the microscope position over the specimen. However, the problem with an aperture smaller than the wavelength of light is that its transmissivity decreases rapidly and is proportional to the radius of the aperture divided by the wavelength to the power 4, i.e. $(d/\lambda)^4$. As a result, much effort has gone into designing better apertures, such as fiber tips. However the transmission efficiency of these apertures is still orders of magnitude less than the optimal efficiency.

In another case, the resolution of photolithography, which is central to the chip manufacturing industry, is also limited in resolution to approximately one-half of the wavelength of the incident light. Techniques such as near-field scanning microscopy can be used to create smaller patterns in the photoresist, however such techniques are generally extremely slow since the photoresist patterns must be written on every chip. Unlike the case for traditional photolithography, the patterns cannot be projected through a mask, the standard industrial technique. In addition, as discussed above, the light transmission efficiency through smaller-than-wavelength apertures, such as tapered optical fibers, is very small. This slows the process even more because a minimum amount of light must impinge upon the photoresist in order to change its characteristics.

In another application, filters made from wire-mesh or metallic grids have been used extensively for filtering light in the far IR (infrared) spectrum (e.g. 10–800 micrometer wavelengths). These filters comprise thin metallic wires (much thinner than the wavelengths to be transmitted) deposited on an optically clear support. The filters are characterized by a transmission spectrum having a peak at approximately 1.2 times the periodicity of the mesh. The peak is very broad, typically greater than half the periodicity of the mesh. Mesh filters have been extensively studied and their properties have been explained by analogy with transmission line circuits. These filters would be much more useful if their transmission spectra could be narrowed to make them more selective.

The main object of the present invention is to overcome the problems and limitations described above by transmitting light very efficiently through an array of apertures, where each aperture is much smaller than one-half of the wavelength of the light and by allowing light transmission only at certain frequencies of light which can be controlled by the structure and arrangement of the aperture array.

SUMMARY OF THE INVENTION

The present invention provides an array of subwavelength apertures in a metallic film or thin metallic plate, each aperture having a diameter d and inter-aperture spacing P. The light transmission properties of such an apparatus are strongly dependent upon the wavelength of the light. Enhanced transmission occurs for light wavelengths in relation to the spacing P. The enhanced transmission is greater than the unit transmission of a single aperture and is believed to be due to the active participation of the metal film in which the aperture array is formed.

If the apertures are viewed, as has previously been the case, as merely geometrical openings, then the transmission efficiency (defined as the transmitted intensity divided by the intensity of the light directly impinging onto the aperture) would be less than one percent. However, in the present invention, as will be described below, the transmission efficiency is greatly increased and the resulting apparatus may be considered as a near-field probe, with the added capability of tailoring the transmission properties of the light at a desired wavelength by adjusting the spacing or periodicity P.

The practical effect of this result is the application of the invention in fields such as wavelength selective optical filtering (particularly in the visible and near-infrared), light beam collecting, near-field scanning optical microscopy and photolithography.

A principal object of the present invention is therefore, the provision of a novel apparatus including an aperture array for enhancing the transmission of light therethrough.

Another object of the invention is the provision of a metal film having an array of apertures for enhanced transmission of light therethrough.

Further and still other objects of the present invention will become more clearly apparent when the following description is read in conjunction with the accompanying drawing.

BRIEF DESCRIPTION OF THE DRAWING

FIG. 7A is a representation of a near-field optical scanning microscope tip relative to a specimen and light source;

FIG. 7B is an expanded view of the frontal surface of the tip in FIG. 7A;

FIG. 7C is a representation of a near-field optical scanning microscope tip relative to a specimen and photodetector;

DETAILED DESCRIPTION

Figure 1:
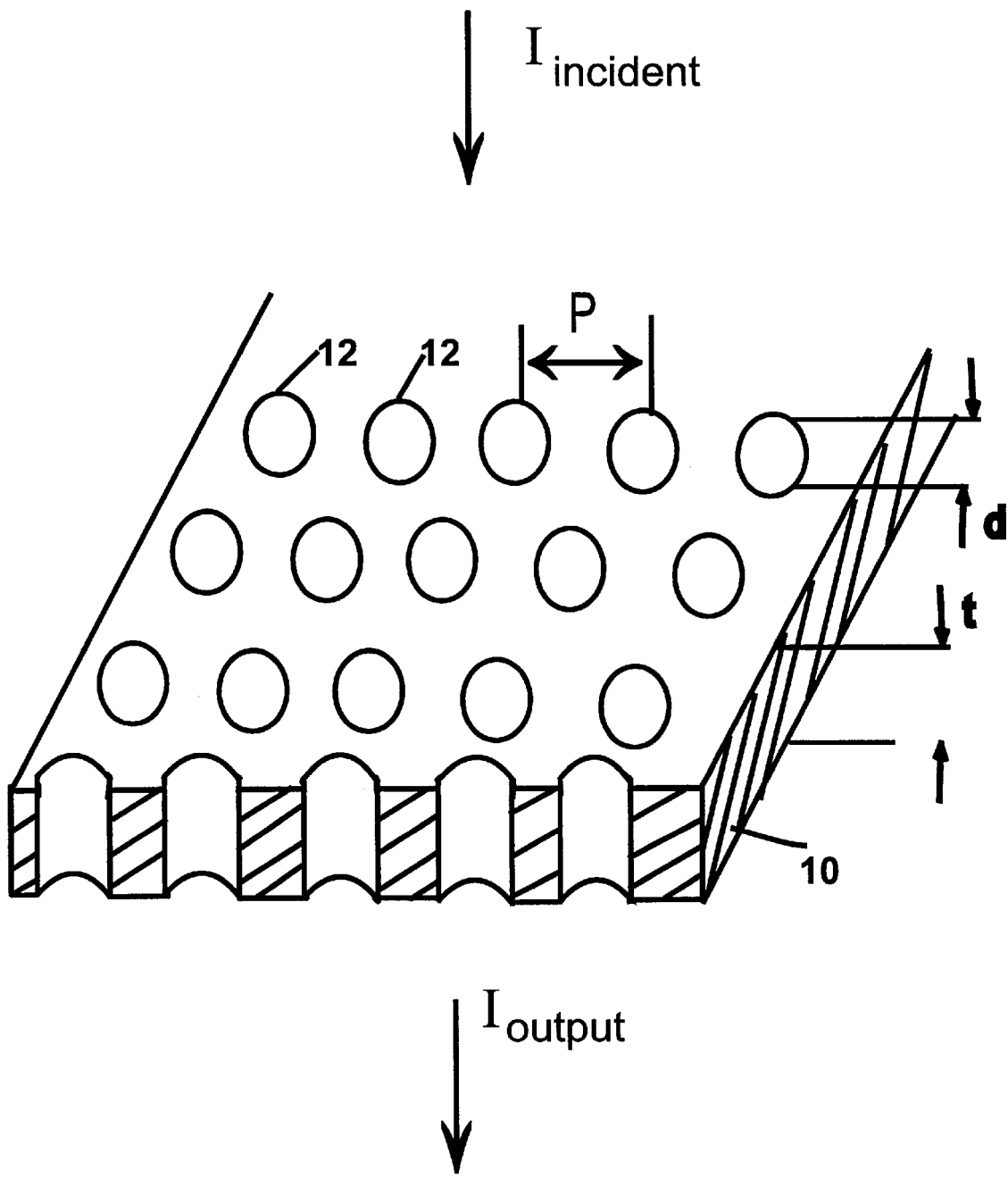
FIG. 1 is a perspective view of an aperture array in a thin film material.

Referring now to the figures and to FIG. 1 in particular, there is shown (not to scale) a thin metal plate or thin metal film 10 containing a rectangular array of cylindrical apertures 12. The metal may be any metal and is preferably Al, Ag, Au or Cr. The diameter of an aperture is d and the periodicity or spacing between apertures is P. The thickness of the metal film or metal plate 10 is preferably in the range of approximately 0.05 to 10 times the aperture diameter. The intensity of the incident light is $I_{INCIDENT}$ and the intensity of the light after traveling through the apertures is $I_{OUTPUT}$. In FIG. 1 an unsupported thin metal plate is shown, however, a thin metal film deposited on a substrate, such as a glass or quartz, is also contemplated by the present invention. While the apertures are shown as round, they may have other shapes, e.g. oval or rectangular. While the array is shown as a rectangular array, other aperture array configurations are also possible, such as triangular, without deviating from the teachings of the invention.

The aperture arrays exhibit distinct zero-order transmission spectra with well-defined peaks. The maxima occurs at wavelengths approximately 10 times the diameter, d, of the individual aperture 12. The transmissivity is much greater than that expected from conventional theory. Our experiments indicate that the unusual optical properties are probably due to the coupling of the incident light with the surface plasmons of the periodic rectangular aperture array in the metal. The coupling becomes extremely strong at wavelengths of incident light larger than the period P. From the peak positions of the transmission spectra as a function of incident angle, dispersion curves are obtained which reflect the structure of a surface plasmon dispersion. It is believed that the array of apertures sufficiently perturb the properties of the metal to result in a well defined surface plasmon energy band structure with gaps. It is this surface plasmon energy band that we believe is responsible for the enhanced transmissitivy through the individual apertures. It is possible that other phenomena, such as diffraction or interference due to array geometry, also contribute to the enhanced transmission.

In a modification of the structure shown in FIG. 1, two-dimensional arrays of cylindrical apertures in metallic films were prepared and analyzed. For example, a silver film of thickness t=0.2 $\mu$m was deposited by evaporation on a fused quartz or glass substrate. The apertures were fabricated through the film by sputtering using a Micrion focused-ion-beam (FIB) System 9500 (50 keV Ga ions, 5 nm nominal spot diameter). The individual hole diameter, d, was varied between 150 nm and 1 $\mu$m and the spacing between holes in the rectangular array, P, was between 0.6 and 1.8 $\mu$m. The zero-order transmission spectra were recorded with a Cary 2 UV-NIR spectrophotometer with an incoherent light source. Additional studies of transmission, diffraction and reflection properties where performed on an optical bench using coherent light sources.

Figure 2:
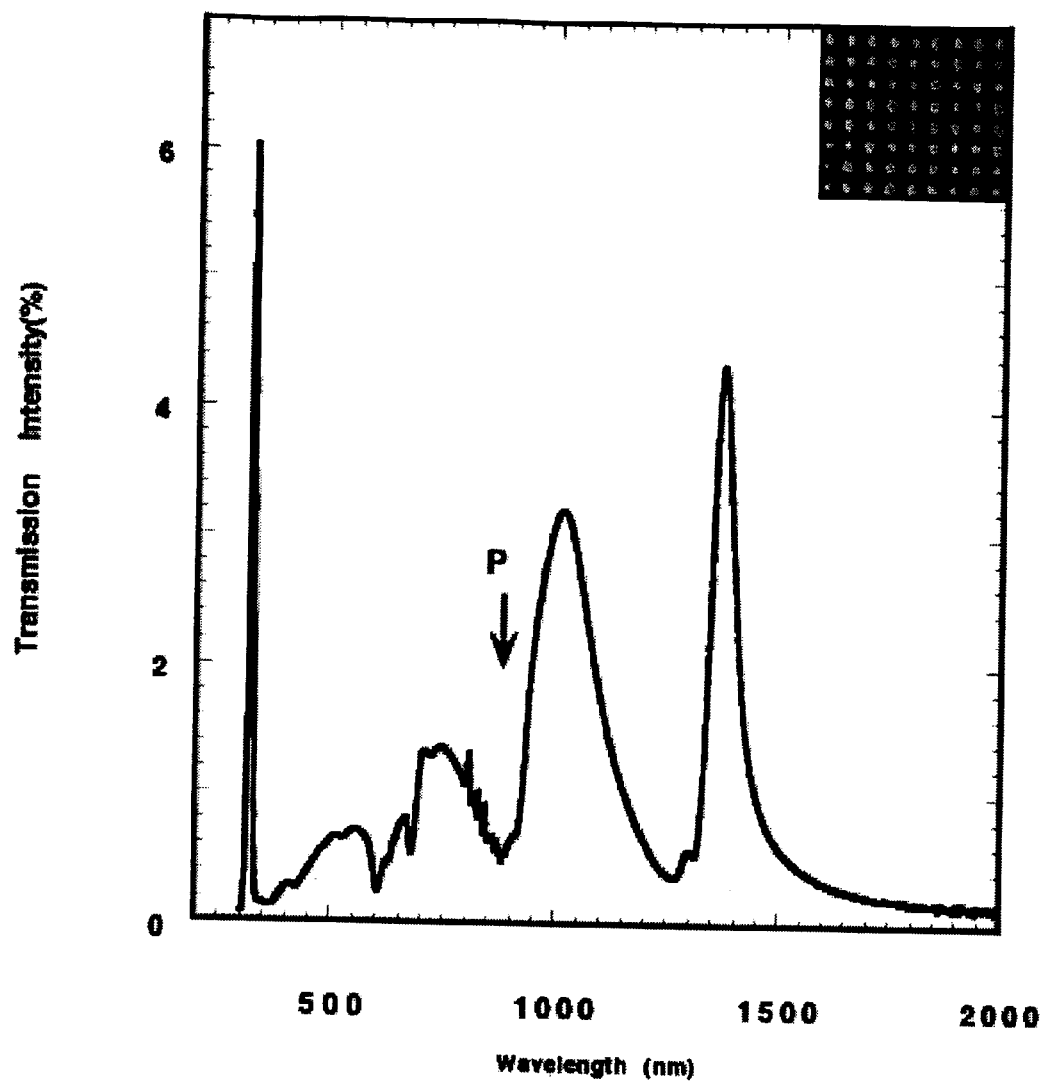
FIG. 2 is a graphical representation of the zero-order transmission spectrum for a rectangular array of apertures in a metal film.

FIG. 2 shows a typical zero-order transmission spectrum for a rectangular array of 150 nm apertures with a periodicity of 0.9 $\mu$m in a 200 nm thick Ag film. The spectrum shows a number of distinct features. At 326 nm, the narrow bulk silver plasmon peak is observed which disappears as the film become thicker. This is an unexpected result and is believed to be the result of resonant excitation of a local plasmon mode. The peaks become gradually stronger at longer wavelengths, increasingly so even beyond the spacing, P.

At long wavelengths there is no diffraction from the aperture array or from individual apertures. The first-order diffraction spots can be seen to be grazing the surface as the wavelength increases towards the spacing P. The maximum transmitted intensity occurs at 1370 nm, nearly ten times the diameter of an individual hole in the array. The absolute transmission efficiency, calculated by dividing the fraction of light transmitted by the fraction of surface area occupied by the holes, is greater than 2 at the maximum. That is, more than twice as much light is transmitted from the aperture array than impinges directly on the apertures. Moreover, the transmissivity of the aperture array increases linearly with the surface area of the holes.

This result is contrary to the expected result that transmission of a single subwavelength aperture is predicted to scale as $(d/\lambda)^4$, so that for a 150 nm diameter hole, the expected transmission efficiency is on the order of $10^{-2}$. See, H. A. Bethe, Theory of Diffraction by Small Holes, Physical Review 66, 163–82, 1944. In addition, the intensity of the zero-order transmission from a grating is expected to decrease monotonically at longer wavelengths $(I \sim 1/\lambda)$. See, M. Born & E. Wolf, Principles of Optics, Pergamon Press, Oxford 1980. Therefore, the present invention yields results indicative of the aperture array itself being an active element and not merely a passive geometrical object located in the path of an incident beam of light.

Figure 3:
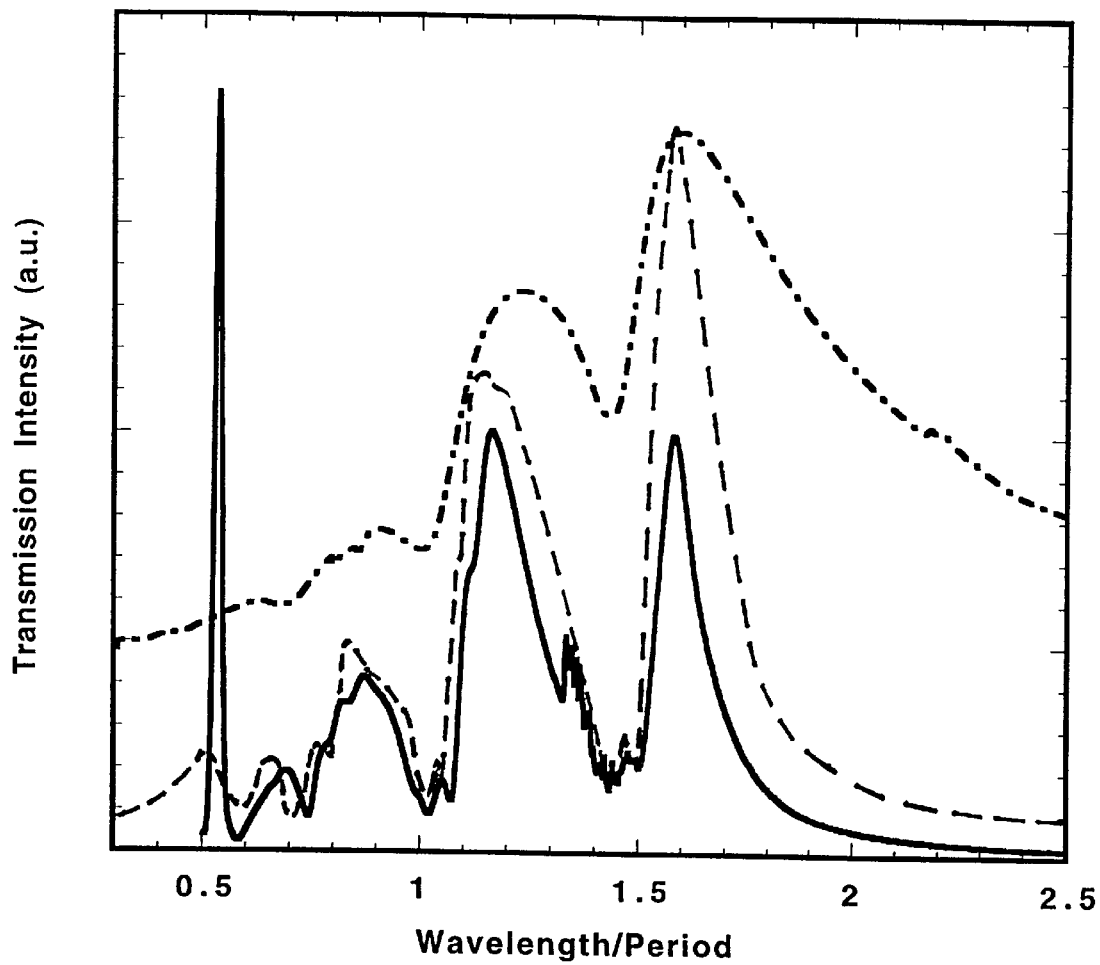
FIG. 3 is a graphical representation of transmission intensity as a function of wavelength, normalized to the period P, for different metals and aperture array geometries.

FIG. 3 shows curves of transmission intensity as a function of wavelength/period for different metals. The solid line is 200 nm Ag film, aperture size of 150 nm and spacing between apertures of 0.6 µm, the dashed line is 300 nm Au film, aperture size of 350 nm and spacing between apertures of 1.0 µm and the dashed-dotted line is 100 nm Cr film, aperture size of 500 nm and spacing of 1.0 µm. The peaks occur in relation to the spacing between apertures, independent of the metal (e.g. Al, Ag, Cr, Au), aperture diameter and film thickness. The width of the peak is strongly dependent on the aspect ratio (t/d or metal film thickness divided by aperture diameter) of the cylindrical holes. For t/d=0.2, the peaks are very broad and when the ratio approaches unity, the maximum sharpness is obtained. The spectra change significantly with the geometric configuration of the apertures, e.g. when the array is square or triangular. The spectra are identical whether the illumination is from the metal side or the substrate side of the array.

Figure 4:
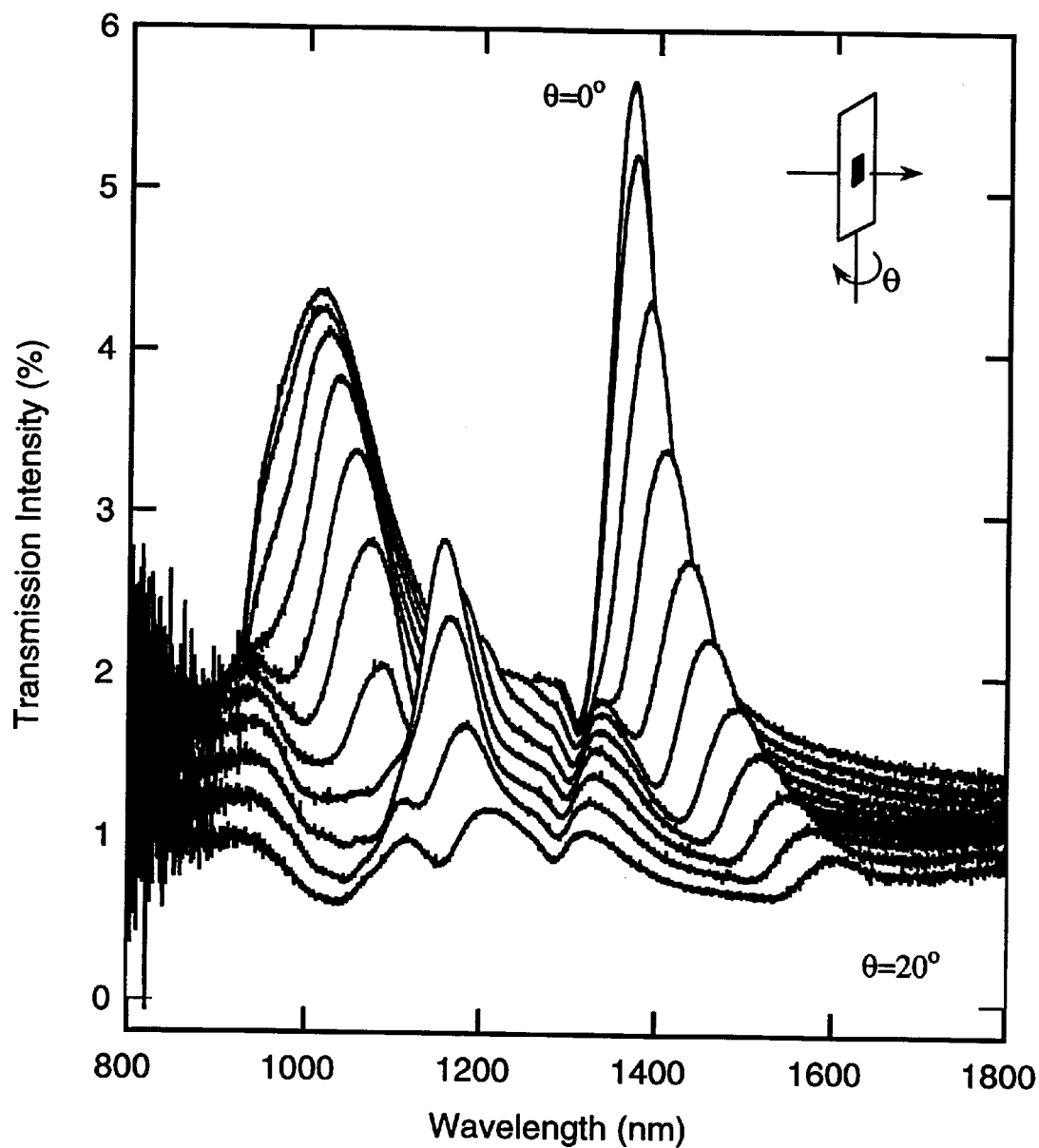
FIG. 4 is a graphical representation of the angular dependence of the incident light on the transmission of light through an aperture array.

The enhanced transmission spectra is dependent upon the angle of the light incident upon the aperture array. FIG. 4 shows the spectra measured for 2 degree changes of incident angles for angles between 0 and 20 degrees. The peaks change in intensity and split into new peaks which move in opposite directions.

Figure 5:
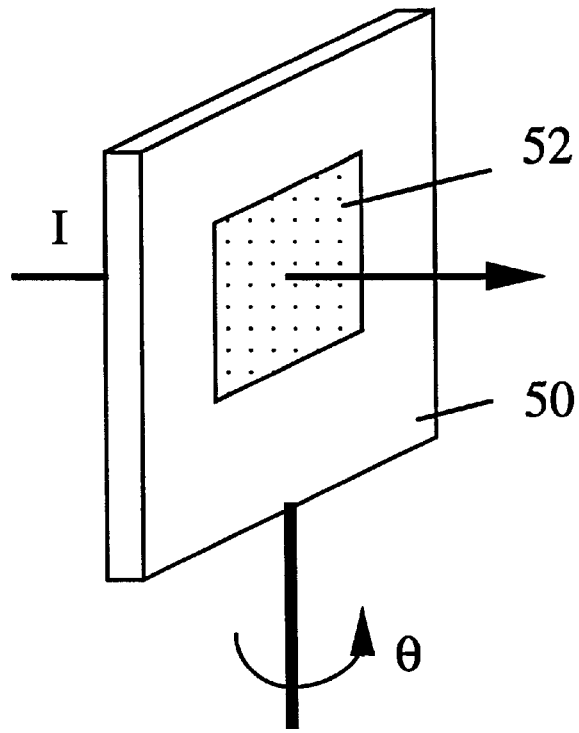
FIG. 5 is schematic representation of an optical filter.

The angular dependence effect results in a novel wavelength selective filter as shown in FIG. 5. By adjusting the angle θ of support 50, and hence the angle of aperture array 52, the wavelength at which the light peaks as a function of the angle is as shown in FIG. 4. By using this property, a filter comprising an aperture array in a metal film, adjusted for a predetermined incidence angle can be formed. The filter can be used for ultraviolet, visible and longer wavelengths. The advantage of the arrangement is that only zero-order light is transmitted and only light at a wavelength corresponding to the incident angle as measured by angle θ.

The aperture arrays are more wavelength selective as filters than conventional mesh array. Moreover, unlike photonic band gap arrays where the material is passive and translucent at all wavelengths except at the energies within the gap, the present invention provides a material that is opaque at all wavelengths except those for which coupling occurs.

Figure 6:
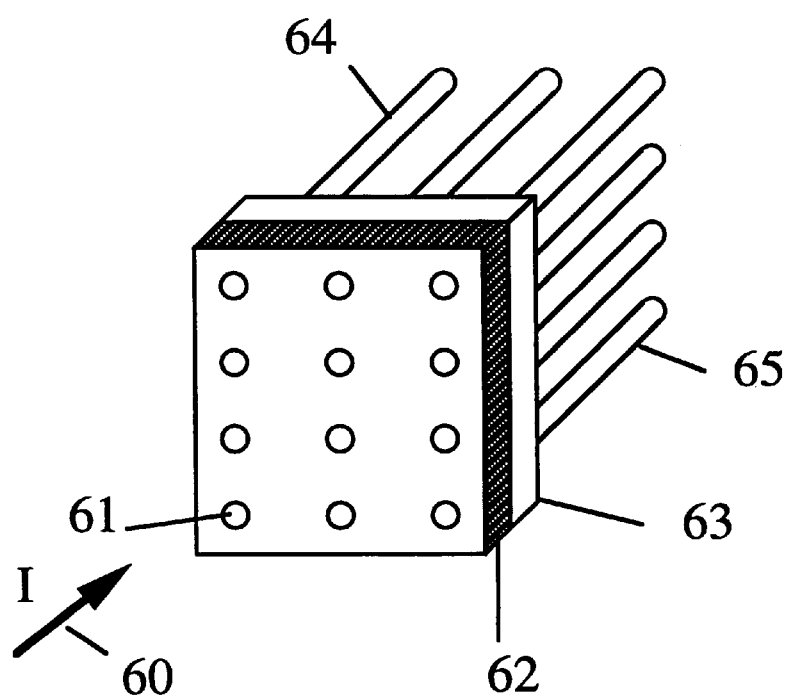
FIG. 6 shows an aperture array used in a light collector.

Another application of the invention is as a light beam collector as shown in FIG. 6. Light 60 is incident on cylindrical apertures 61 in metal film 62 deposited on substrate 63. After traveling through the array of apertures 61, the collected light travels to optic fibers in a bundle or array of fibers 65 in juxtaposition to the apertures. The intensity of the light passing through the aperture array and entering into the fibers is enhanced by the present invention. The aspect ratio of the apertures is not critical but the spacing P between apertures is important for determining the wavelength of the enhanced light collection as shown in FIG. 6. Previously, it was difficult to direct light into subwavelength fibers. Complex lenses and alignment devices were used to direct the light. Since in the present invention the apertures transmit more light than the aperture surface area, the metal aperture array acts like a light collector and hence, coupling light into subwavelength fibers is efficient.

Another application for the aperture array is in near-field scanning optical microscopy. FIG. 7A shows the general arrangement used in near-field scanning optical microscopy where a light source 70 transmits light through a specimen 71 supported by a support into a scanning tip 72 which acts as a light collector. In accordance with the teachings of the present invention, the frontal surface 73 of the tip 72 includes two or more subwavelength apertures 74 (FIG. 7B) in a metallic film coating on the surface 73 for increasing the intensity of the light received by the probe for subsequent conventional NSOM signal processing. This configuration is most effective when the coating is Ag and a He—Cd laser is the light source. In FIG. 7C the probe acts as the light source and transmits light from the probe tip 75 via apertures 76 in the frontal surface 77, through the specimen 71, to a photodetector 78 for conventional signal processing. The inclusion of at least two apertures 76 in the frontal surface 77 of the probe tip 75 in FIG. 7C increases the light transmitted from the probe tip 75 into the specimen for subsequent collection at photodetector 78.

Figure 8A:
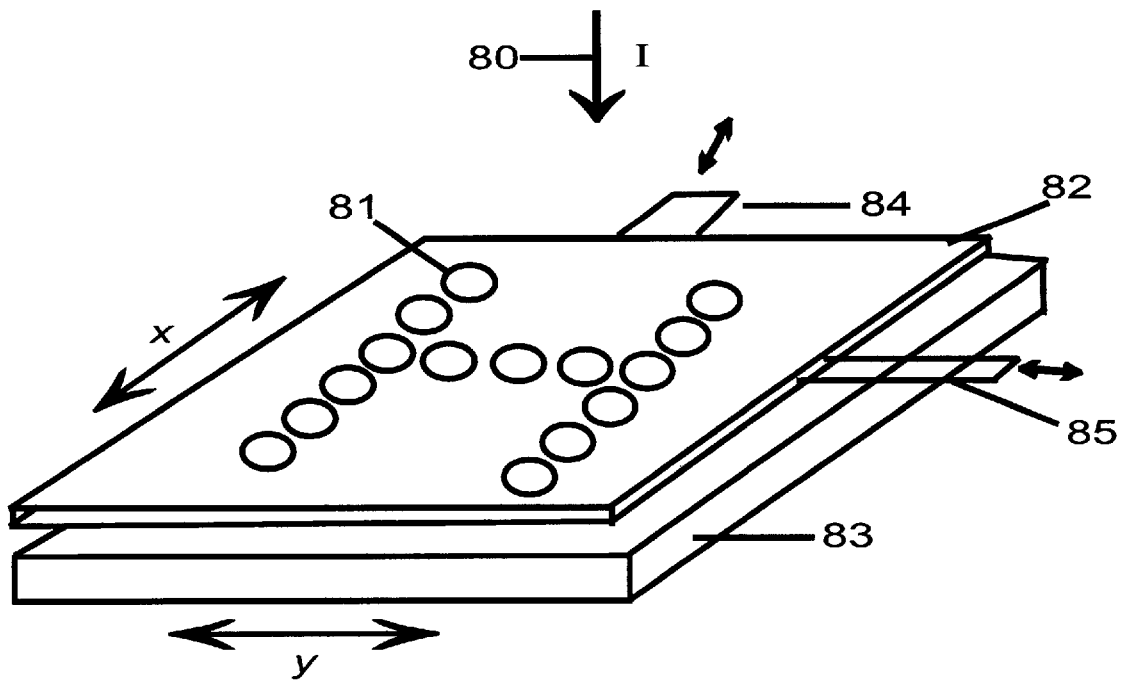
FIG. 8A shows an aperture array on a metal film used for photolithography.

In another application of the invention shown in FIG. 8A, the high transmission efficiency of the aperture array can be used to make novel masks for sub-wavelength photolithography by virtue of the arrangement of very small apertures in a metallic mask. Light 80 having a wavelength λ, much greater than the diameter of the apertures, can be projected through the apertures 81 in a metal plate or metal film deposited on a substrate 82 to yield lithographic structures having features much smaller than λ/2.

Figure 8B:
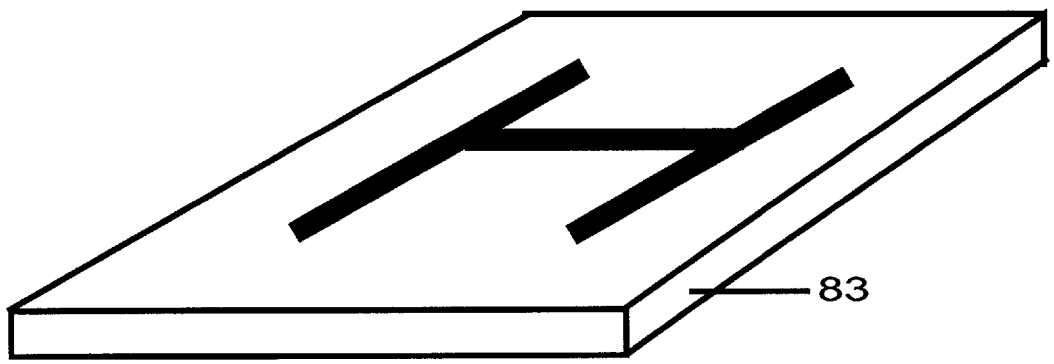
FIG. 8B shows a substrate with lines written thereon.

In order to image a two-directional subwavelength line width, which for illustrative purposes is shown in the form of the letter H, onto substrate 83 coated with photosensitive material as shown in FIG. 8A, the apertures 81 are separated a distance dependent on the wavelength of the light to "image" an x-direction and a y-direction line in the photosensitive material coated on substrate 83. In order to write a line in the x-direction light polarized in the x-direction is transmitted through the aperture array. Light polarized in the x-direction will not pass through lines in the y-direction. The mask and substrate are made to undergo relative translatory motion of one-half the period or space between apertures in the x-direction by use of actuator 84. Since the film only has apertures, lines can be written only if the apertures are moved along a linear path relative to the substrate 83. The procedure is then repeated for lines in the y-direction using y-direction polarized light and actuator 85. FIG. 8B shows the substrate 83 with the letter H written into the photoresist coating.

Figure 9:
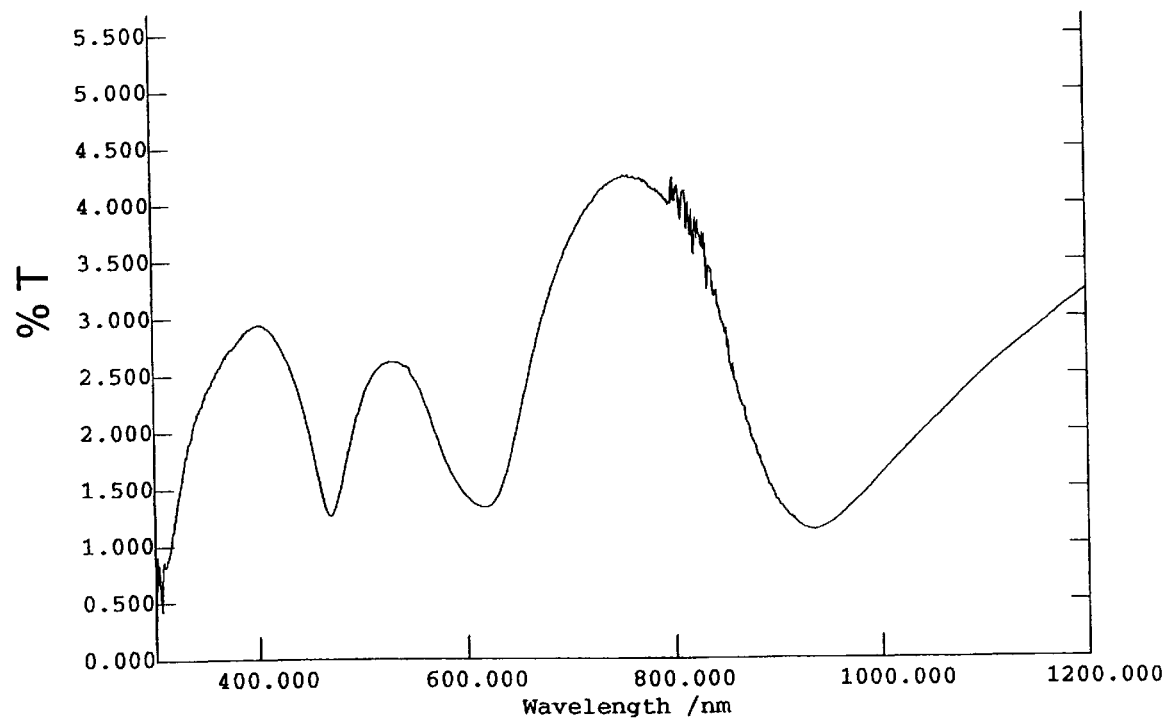
FIG. 9 is a graphical representation of the transmission efficiency as a function of wavelength for a thin film material having parallel slits therein.

In an alternative photolithography arrangement, the apertures 81 in the thin film metallic mask are replaced by parallel slits. FIG. 9 is a graph of the transmission efficiency ($I_{OUTPUT}/I_{INCIDENT}$) as a function of wavelength for a thin aluminum film having parallel slots 0.15 μm wide by 40 μm long spaced 0.6 μm apart. The incident light was polarized at 90 degrees in the plane transverse to the longitudinal axis of the slit. The mask containing slits and light are used in the same manner as the apertured mask. Of course, by using a slit of sufficient length, it may be possible to avoid the necessity of moving the mask relative to the substrate.

In a further alternative arrangement, the apertures are located in the metal film in the pattern of Fresnel zone lenses to focus the light at the focal points of the lenses. The mask containing the apertures will undergo motion as described in conjunction with the aperture mask in FIG. 8A. The aperture pattern in the film resembles a rectangular array, but the apertures are only present at those locations of the rectangular array corresponding to a Fresnel zone lens pattern.

The use of the aperture array as described for photolithography allows subwavelength lines to be written without using deep-UV and X-ray sources while at the same time permitting the use of conventional photoresists.

Figure 10A:
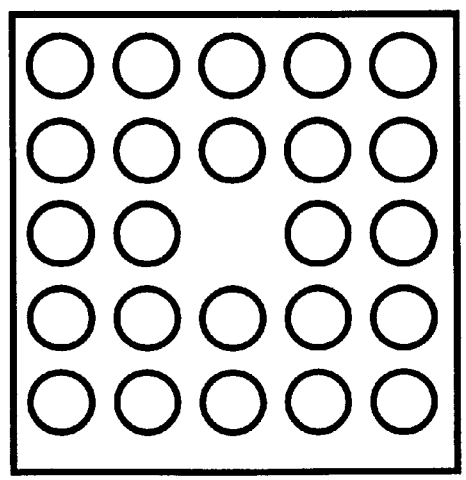
FIG. 10A is a plan view of rectangular aperture array without the outer aperture.

Variations and modifications of the aperture array are possible without materially affecting the light transmission through the apertures. For example, FIG. 10A shows a square array of 25 apertures 100 in a thin metallic film 102 in which one aperture, the center aperture, is missing.

Figure 10B:
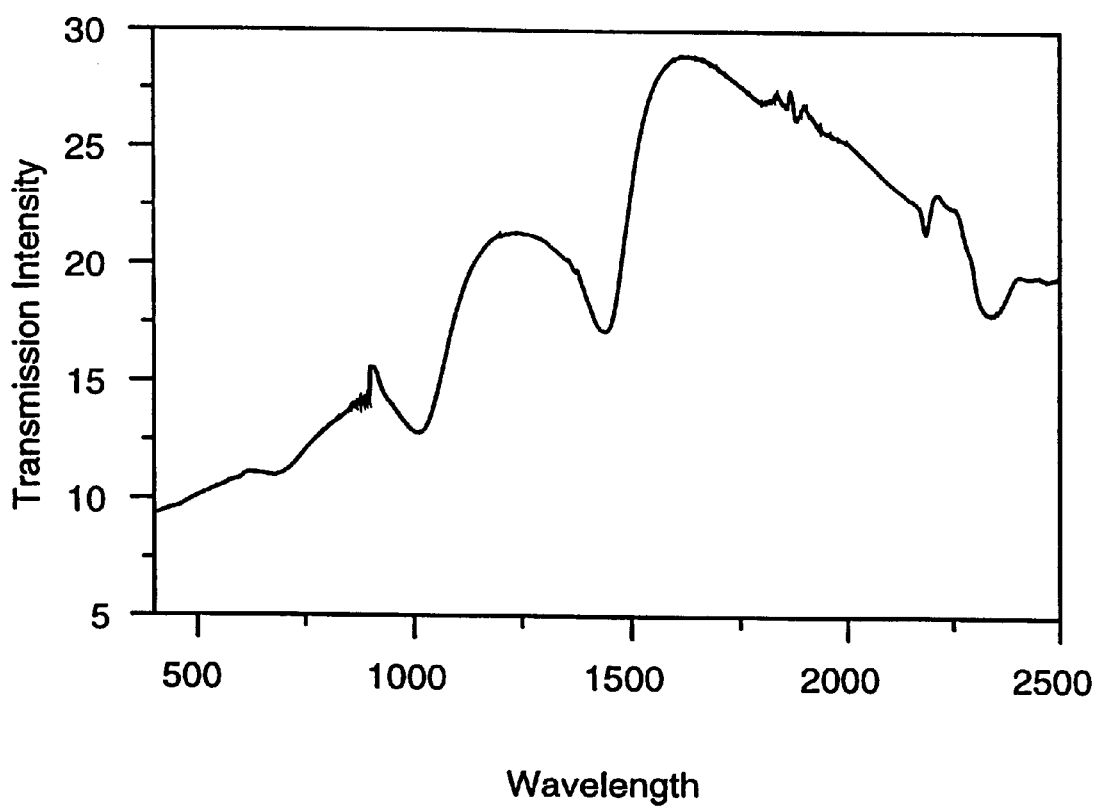
FIG. 10B is a graphical representation of the transmission intensity as a function of wavelength for the aperture array in FIG. 10A.

FIG. 10B is a graph of the transmission intensity as a function of wavelength for an array of 0.5 μm diameter apertures spaced 1 μm apart in 0.1 μm thick chrome film, with one aperture, the center aperture, missing from the array.

Figure 11A:
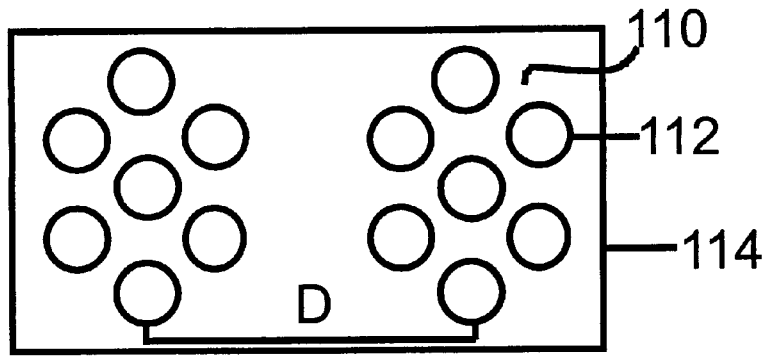
FIG. 11A is a plan view of an alternative aperture array pattern.
Figure 11B:
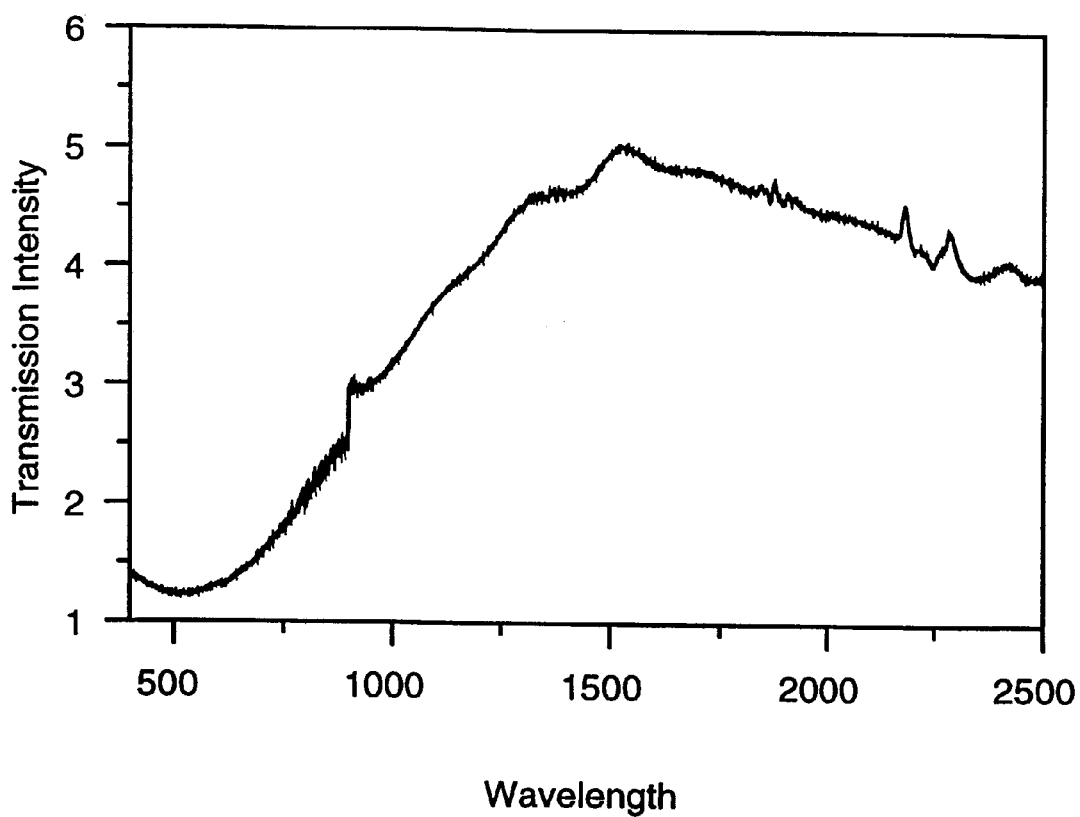
FIG. 11B is a graphical representation of the transmission intensity as a function of wavelength for the aperture array in FIG. 11A.

In FIG. 11A a repeated pattern of groups 110 of seven apertures 112 in thin metallic film 114 are spaced apart by a distance D. FIG. 11B is a graph of the transmitted intensity as a function of wavelength for an array of apertures as shown in FIG. 11A where the apertures have a diameter of 0.5 μm, spacing of 1 μm and the groups are separated by a distance D of 5 μm in a chrome film having a thickness of 0.1 μm.

The graphs show that arrays having missing apertures or array of aperture patterns other than a rectangular array yield similar results to square aperture arrays.

While the figures show the light being incident to the metal film side of a substrate having a metal coating on one side thereof, similar results are achieved when the light is incident on the substrate side, opposite the metal film.

While there has been described and illustrated an aperture array in a metallic film or thin metallic plate for use in certain applications, it will be apparent to those skilled in the art that variations and modifications are possible without deviating from the spirit and broad teachings of the invention which shall be limited solely by the scope of the claims appended hereto.

What is claimed is:

1. A near-field scanning optical microscope comprising:

a light source;

a probe having a frontal surface disposed relative to said light source for receiving light from said light source;

said frontal surface having a metallic film containing an array of apertures therein disposed thereon, said apertures in the array being spaced apart by a distance P, where P is selected dependent upon the wavelength of light incident on said array, whereby incident light at a predetermined wavelength will perturb the metallic film in a surface plasmon energy band for enhancing transmission of light through individual apertures in said array; and photodetector means for receiving light traversing said metallic film.

2. A near-field scanning optical microscope comprising:

a light source;

a probe including a frontal surface having a metallic film containing an array of apertures therein disposed thereon coupled to said light source for emitting light from said apertures, said apertures in the array being spaced apart by a distance P, where P is selected dependent upon the wavelength of light incident on said array, whereby incident light at a predetermined wavelength will perturb the metallic film in a surface plasmon energy band for enhancing transmission of light through individual apertures in said array; and detector means disposed relative to said frontal surface for receiving light emitted from said apertures.

3. A near-field scanning optical microscope as set forth in claim 1, where said metallic film is Ag.

4. A near-field scanning optical microscope as set forth in claim 1, where said light source is a He—Cd laser.

5. A near-field scanning optical microscope as set forth in claim 1, where said array of apertures comprises two or more subwavelength apertures.

6. A near-field scanning optical microscope as set forth in claim 2, where said metallic film is Ag.

7. A near-field scanning optical microscope as set forth in claim 2, where said light source is a He—Cd laser.

8. A near-field scanning optical microscope as set forth in claim 2, where said array of apertures comprises two or more subwavelength apertures.

* * * * *